(12) United States Patent
Hashimoto

(10) Patent No.: US 7,972,750 B2
(45) Date of Patent: Jul. 5, 2011

(54) MASK BLANK AND MASK

(75) Inventor: Masahiro Hashimoto, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 340 days.

(21) Appl. No.: 12/097,699

(22) PCT Filed: Dec. 18, 2006

(86) PCT No.: PCT/JP2006/325189
§ 371 (c)(1),
(2), (4) Date: Jun. 16, 2008

(87) PCT Pub. No.: WO2007/072778
PCT Pub. Date: Jun. 28, 2007

(65) Prior Publication Data
US 2009/0047584 A1    Feb. 19, 2009

(30) Foreign Application Priority Data

Dec. 21, 2005   (JP) ................................ 2005-368617

(51) Int. Cl.
*G03F 1/00* (2006.01)
(52) U.S. Cl. ............................................... 430/4; 430/5
(58) Field of Classification Search ............... 430/4–5
See application file for complete search history.

(56) References Cited

U.S. PATENT DOCUMENTS

| | | | |
|---|---|---|---|
| 2007/0190459 A1* | 8/2007 | Hashimoto et al. | 430/5 |
| 2008/0070132 A1* | 3/2008 | Hashimoto et al. | 430/5 |
| 2009/0155698 A1 | 6/2009 | Yamada et al. | |

FOREIGN PATENT DOCUMENTS

| | | |
|---|---|---|
| JP | 06-224118 A | 8/1994 |
| JP | 10-199789 A | 7/1998 |
| JP | 2001-189261 A | 7/2001 |
| JP | 2001-264998 A | 9/2001 |
| JP | 2002-006506 A | 1/2002 |
| JP | 2002-099086 A | 4/2002 |
| JP | 2003-107675 A | 4/2003 |
| JP | 2005-142339 A | 6/2005 |
| KR | 20050119202 A | 12/2005 |
| WO | 2007029826 A1 | 3/2007 |

OTHER PUBLICATIONS

JP-2003-107675 English Translation with abstract, 8 pages, Apr. 9, 2003.*
Korean Office Action corresponding to Korean Patent Application No. 10-2008-7017677, Dec. 21, 2009.
German Office Action, dated Oct. 2, 2009 (corresponding to German Patent Application No. 11 2006 003 495.2-51).

* cited by examiner

*Primary Examiner* — Mark F Huff
*Assistant Examiner* — John Ruggles
(74) *Attorney, Agent, or Firm* — Sughrue Mion, PLLC

(57) ABSTRACT

The mask blank is patterned to form a corresponding mask having a light shielding film pattern with enhanced resolution. A mask blank (10) on which a chemically amplified resist film (20) is formed, the mask blank (10) comprising a substrate (12), a light shielding film (13) provided on the substrate (12), and a resist underlying film (18) provided on the light shielding film (13), for suppressing the deactivation of the chemically amplified resist film (20). When the light shielding film (13) is etched using the patterned chemically amplified resist film (20) as a mask, the etching rate of the deactivation preventive film (18) is higher than the etching rate of the chemically amplified resist film (20).

21 Claims, 2 Drawing Sheets

MASK BLANK AND MASK

TECHNICAL FIELD

This invention relates to a mask blank and a mask for use in the manufacture of semiconductor devices, liquid crystal display devices, or the like.

BACKGROUND ART

For example, a photomask (reticle) for use in the semiconductor device microfabrication technology is manufactured by patterning a light-shielding film in the form of a thin film, formed on a transparent substrate, into a transfer pattern. The patterning of the light-shielding film is performed, for example, by dry etching using a resist pattern as a mask. The resist pattern is formed, for example, by the electron beam lithography or the like.

In recent years, in the mask manufacturing field, it has been studied to set the acceleration voltage of an electron beam used in the electron beam lithography to 50 keV or more. This is because it is necessary to reduce forward scattering of an electron beam passing through an electron beam resist and thus to raise the convergence of the electron beam, thereby resolving a finer resist pattern. If the acceleration voltage of the electron beam is low, the forward scattering occurs at the resist surface or in the resist and, when the forward scattering is present, the resolution of the resist is degraded. However, if the acceleration voltage of the electron beam is set to 50 keV or more, the forward scattering decreases in inverse proportion to the acceleration voltage so that the energy applied to the resist due to the forward scattering decreases. Therefore, for example, with an electron beam resist that is used when the acceleration voltage is 10 to 20 keV or the like, the sensitivity of the resist is insufficient and thus the throughput drops. Therefore, also in the mask manufacturing field, it has become necessary to use a chemically amplified resist film as has been used in the semiconductor wafer microfabrication technology. The chemically amplified resist film is highly sensitive to a high acceleration voltage and has a high resolution.

Herein, it is known that when a chemically amplified resist film is used in the mask manufacturing field, for example, in the state where the film density near the surface of a light-shielding film being an underlying film thereof is relatively sparse or rough, there may arise a problem of deactivation of the chemically amplified resist film. Specifically, there is a case where acid catalysis reactions during patterning are prevented at the interface between the light-shielding film being the underlying film and the chemically amplified resist film, so that the resolution is degraded at the bottom of a resist pattern. In this case, there occurs shape failure such as, for example, footing with the positive type chemically amplified resist film or undercutting with the negative type.

This is considered to be caused, for example, by the fact that acid produced in the chemically amplified resist film by exposure is suppressed (quenched) by base components on the chromium oxide surface, the acid diffuses to the light-shielding film side, and so on, so that the sensitivity of the chemically amplified resist film at the interface with the light-shielding film is apparently lowered. In order to solve this problem, a configuration has conventionally been known in which a mask blank is provided with a deactivation suppression film (see, e.g. Patent Document 1). Patent Document 1 discloses a configuration in which an inorganic film of a silicide-based material, an organic BARC, or the like is introduced as an intermediate layer (deactivation suppression film).

Patent Document 1: JP-A-2003-107675

DISCLOSURE OF THE INVENTION

Problem to be Solved by the Invention

The inventor of this application has assiduously studied about a possible problem caused by the formation of the deactivation suppression film and found out that there is a problem of degradation in resolution of patterning of a light-shielding film due to the influence of the deactivation suppression film. For example, there was a case where when dry-etching a deactivation suppression film and a light-shielding film using a resist pattern of a chemically amplified resist film as a mask, the chemically amplified resist film was also etched while etching the deactivation suppression film, so that the resolution of the resist pattern was lowered. In such a case, even if the resolution of the resist pattern immediately after the formation thereof is high, the resolution of the resist pattern is lowered when the light-shielding film is etched. Further, the resolution of patterning of the light-shielding film, which is etched with this resist pattern used as a mask, is also lowered. Therefore, conventionally, there was a case where, in the mask manufacturing field, even if a chemically amplified resist film was used, when the line width of a pattern is reduced for pitch narrowing to 65 nm or further to 45 nm in the semiconductor design rule, it was not possible to sufficiently enhance the resolution of patterning of a light-shielding film.

Further, the inventor of this application has also assiduously studied about a possible problem caused by the use of the chemically amplified resist film itself in the mask manufacturing field and found out that there is a case where, depending on the composition of an underlayer in contact with the chemically amplified resist film, sufficient adhesion between the chemically amplified resist film and the underlying film cannot be obtained. For example, there was a case where when an underlayer was a silicon-containing film containing silicon, the adhesion between a chemically amplified resist film and the silicon-containing film was insufficient so that a resist pattern disappeared during development. Further, there was a case where the coatability was not sufficient so that it was difficult to form a uniform chemically amplified resist film.

It is therefore an object of this invention to provide a mask blank and a mask that can solve the problems described above.

Means for Solving the Problem

In order to achieve the above-mentioned object, this invention has the following structures.

(Configuration 1) A mask blank to be formed with a chemically amplified resist film, the mask blank comprising: a substrate, a thin film to be a transfer pattern or a thin film for forming a transfer pattern, the thin film formed above the substrate, and a resist-underlying film formed between the chemically amplified resist film and the thin film, wherein the thin film contains a metal and at least one element of oxygen and nitrogen, and when the thin film is etched using as a mask the chemically amplified resist film patterned, an etching rate of the resist-underlying film is higher than that of the chemically amplified resist film.

If a resist-underlying film having an etching rate lower than that of a chemically amplified resist film is formed between a thin film to be a transfer pattern or a thin film for forming a transfer pattern and the chemically amplified resist film, since the chemically amplified resist film is also etched while etching the resist-underlying film, there is a case where the resist-underlying film causes an impediment to improvement in resolution of the thin film to be the transfer pattern or the thin film for forming the transfer pattern (e.g. a light-shielding film). Therefore, in such a case, there is a possibility that even if the resolution of a resist pattern is enhanced by the resist-underlying film (e.g. a resist-underlying film having the deactivation suppression function), this does not substantially lead to an improvement in mask resolution. Further, when patterning the thin film by etching using the resist pattern as a mask, if the etching rate of the thin film is low, this leads to disappearance of the resist pattern before patterning of the thin film is finished, so that the pattern accuracy of the thin film is degraded. However, in the case of Configuration 1, since the etching rate of the resist-underlying film is higher than that of the chemically amplified resist film, etching of the chemically amplified resist film is suppressed while etching the resist-underlying film and, further, since the thin film contains a metal and at least one element of oxygen and nitrogen, it is possible to increase the etching rate of the thin film. Consequently, the thin film to be the transfer pattern or the thin film for forming the transfer pattern can be etched while maintaining the resolution immediately after the formation of the resist pattern. This makes it possible to increase the resolution of patterning of the thin film to be the transfer pattern or the thin film for forming the transfer pattern and thus to enhance the line-width accuracy of a thin film pattern.

The chemically amplified resist film is, for example, a resist film that exhibits a resist function when the acid of the catalyst substance generated in the resist film by exposure reacts with the functional group or functional substance, serving to control the solubility of the polymer, in a subsequent heat treatment process. To exhibit the resist function is, for example, to dissolve into alkali by removing the functional group or the like. The chemically amplified resist film is preferably subjected to resist writing (exposure) with an electron beam accelerated by an acceleration voltage of 50 keV or more.

(Configuration 2) A mask blank to be formed with a chemically amplified resist film, the mask blank comprising: a substrate, thin film to be a transfer pattern, the thin film formed on the substrate, a silicon-containing film formed on the thin film and made of a material containing silicon, and resist-underlying film formed between the chemically amplified resist film and the silicon-containing film, herein the resist-underlying film is made of an organic material, and then the silicon-containing film is etched using as a mask the chemically amplified resist film patterned, an etching rate of the resist-underlying film is higher than that of the chemically amplified resist film. With this configuration, the adhesion between the silicon-containing film and the chemically amplified resist film can be improved. Consequently, the chemically amplified resist film can be properly formed above the silicon-containing film. This silicon-containing film is, for example, a film for use as a hard mask that is used when patterning the thin film to be the transfer pattern. With this configuration, the chemically amplified resist film can be properly used in a hard mask blank. Further, for the same reason as Configuration 1, it is possible to increase the resolution of patterning of the silicon-containing film and thus to enhance the line-width accuracy of a silicon-containing film pattern.

(Configuration 3) The resist-underlying film has a film thickness of 25 nm or less. With this configuration, since the chemically amplified resist film is hardly etched while etching the resist-underlying film, the resolution of patterning of the thin film to be the transfer pattern or the thin film for forming the transfer pattern can be further enhanced while maintaining the resolution immediately after the formation of the resist pattern.

(Configuration 4) The chemically amplified resist film has a film thickness of 300 nm or less. With this configuration, the resolution of a thin film pattern required in the 65 nm or less semiconductor design rule can be obtained.

(Configuration 5) The thin film contains chromium and at least one element of oxygen and nitrogen. An upper layer portion of the thin film may have an antireflection function. In order to provide the antireflection function, it is preferable to use chromium oxide, chromium nitride, or chromium oxynitride as a material of the upper layer portion. On the other hand, on the substrate side of the thin film, a lower layer portion of the thin film may have chromium nitride containing nitrogen in order to improve the adhesion of the thin film to its underlayer. When use is made of the thin film containing chromium and at least one element of oxygen and nitrogen, the thin film is, for example, dry-etched with a chlorine-based gas using the resist pattern as a mask. In this case, even when the etching rate of the resist-underlying film is higher than that of the chemically amplified resist film, if the etching rate of the thin film to be patterned using the resist pattern as a mask is low, the resolution of a thin film pattern cannot be improved. However, with Configuration 5, since the etching rate (dry etching rate) of the thin film can be increased, the resolution and positional accuracy of a thin film pattern becomes excellent.

(Configuration 6) The mask blank is preferably a mask blank for a dry etching process adapted to a fabrication method of a mask used for patterning the thin film to be the transfer pattern or the thin film for forming the transfer pattern, by the dry etching process with a chlorine-based dry etching gas containing chlorine that uses as the mask a resist pattern formed from the chemically amplified resist.

(Configuration 7) The mask blank further comprises the chemically amplified resist film. With this configuration, the resolution of the thin film to be the transfer pattern or the thin film for forming the transfer pattern can be properly enhanced. Further, the deactivation of the chemically amplified resist film can be properly suppressed.

(Configuration 8) A mask comprising a transfer pattern formed by patterning the thin film in the mask blank according to any one of Configurations 1 to 7. With this configuration, the same effects as those of Configurations 1 to 7 can be obtained.

In the foregoing, a photomask blank, a phase shift mask blank, a reflective mask blank, and an in-print transfer plate substrate are included in mask blanks. Further, a mask blank with a chemically amplified resist film and a mask blank before formation of a chemically amplified resist film are included in mask blanks. A mask blank formed with a resist-underlying film on a thin film to be a transfer pattern or a thin film for forming a transfer pattern is also included in mask blanks before formation of a chemically amplified resist film. A phase shift mask blank includes a case where a light-shielding film of a chromium-based material or the like is formed on a halftone film. In this case, a thin film to be a transfer pattern represents the halftone film or the light-shielding film. A reflective mask blank includes a configuration in which an absorbent film of a tantalum-based material or a chromium-based material to be a transfer pattern is formed on a multilayer reflective film or a buffer layer provided on the multilayer reflective film. An in-print transfer plate includes a configuration in which a thin film for transfer pattern formation of a chromium-based material or the like is formed on a base member that serves as a transfer plate. A photomask, a phase shift mask, a reflective mask, and an in-print transfer plate are included in masks. A reticle is included in masks.

In the foregoing, a light-shielding film serving to shield exposure light and a halftone film having a light-shielding function and a phase shift function are included in light-shielding films. There is no particular limitation to a film material, a film composition, a film structure, a film thickness, or the like of the light-shielding film. As the material of the light-shielding film, there is cited chromium alone, a material containing chromium and at least one kind of element from among oxygen, nitrogen, and carbon (a material containing Cr), a film material that is subjected to footing or undercutting at the bottom of a resist pattern when a chemically amplified resist film such as an acetal-based resist for LEAR (Low Energy Activation Resist) or a SCAP-based resist for HEAR (High Energy Activation Resist) is directly formed on a light-shielding film, or the like.

The film composition of the light-shielding film is properly adjusted depending on the optical properties (optical density, reflectance, etc. in a photomask blank, transmittance, phase shift amount, etc. in a phase shift mask blank), the etching characteristics (etching rate in depth direction) in terms of achieving good pattern shapes, and so on. The film structure of the light-shielding film can be a structure of a single layer or a plurality of layers made of the above film material. In the case of different compositions, it can be a structure of a plurality of layers formed stepwise or a film structure in which the composition continuously changes. The film thickness of the light-shielding film is properly adjusted depending on the optical properties (optical density etc. in a photomask blank, transmittance, phase shift amount, etc. in a phase shift mask blank). In the case of a photomask blank, the film thickness of a light-shielding film is, for example, 30 to 150 nm. In the case of a phase shift mask blank, the film thickness of a halftone film having a light-shielding function and a phase shift function is, for example, 50 to 150 nm.

Effect of the Invention

According to this invention, when a chemically amplified resist film is used, it is possible to enhance the resolution of patterning of a thin film to be a transfer pattern or a thin film for forming a transfer pattern, thereby increasing the linewidth accuracy of the thin film pattern. Further, when a silicon-containing film containing silicon is used as an underlayer of a chemically amplified resist film, it is possible to improve the adhesion between the silicon-containing film and the chemically amplified resist film.

BEST MODE FOR CARRYING OUT THE INVENTION

Hereinbelow, embodiments according to this invention will be described with reference to the drawings.

FIG. 1 shows an example of a mask blank 10 according to a first embodiment of this invention. FIG. 1 (a) shows an example of the configuration of the mask blank 10. In this example, the mask blank 10 is a mask blank for a binary mask and comprises a transparent substrate 12, a light-shielding film 13 (a laminated film of a light-shielding layer 14 and an antireflection layer 16), a resist-underlying film 18, and a chemically amplified resist film 20.

For example, the transparent substrate 12 is a synthetic quartz substrate or is made of a material such as a soda-lime glass. The light-shielding film 13 is an example of a thin film to be a transfer pattern and is a laminated film of the light-shielding layer 14 and the antireflection layer 16. The light-shielding layer 14 has a chromium nitride film 22 and a chromium carbonitride film 24 in the order named on the transparent substrate 12. The chromium nitride film 22 is a layer mainly containing chromium nitride (CrN) and has a film thickness of, for example, 10 to 20 nm. The chromium carbonitride film 24 is a layer mainly containing chromium carbonitride (CrCN) and has a film thickness of, for example, 25 to 60 nm.

The antireflection layer 16 is a film (CrON film) containing oxygen and nitrogen in chromium and is formed on the chromium carbonitride film 24. The film thickness of the antireflection layer 16 is, for example, 15 to 30 nm. The antireflection layer 16 may be a film mainly containing chromium oxide (CrO).

As described above, the light-shielding film 13 is composed of the materials of the chromium nitride film 22, the chromium carbonitride film 24, and the chromium oxynitride film from the transparent substrate 12 side and contains chromium and at least one element of oxygen and nitrogen in the entire light-shielding film. Therefore, it is possible to increase the dry-etching rate during dry etching using a resist pattern as a mask and using a chlorine-based gas. Consequently, it is possible to suppress damage to the chemically amplified resist film during the dry etching and thus to form a narrow-pitch fine thin film pattern (transfer pattern).

The resist-underlying film 18 is a layer for suppressing deactivation of the chemically amplified resist film 20 and is formed on the light-shielding film 13. The film thickness of the resist-underlying film 18 is properly adjusted depending on the film thickness of the chemically amplified resist film 20 and the etching rates of the chemically amplified resist film and the resist-underlying film when patterning the light-shielding film 13 using the resist pattern as a mask. For example, if the film thickness of the chemically amplified resist film 20 is 300 nm or less, the film thickness of the resist-underlying film 18 is preferably 25 nm or less and is preferably 20 nm or less in view of a CD bias. On the other hand, in view of the deactivation suppression function, the film thickness of the resist-underlying film 18 is preferably 1 nm or more. In view of the above points, the film thickness of the resist-underlying film 18 is preferably 1 to 25 nm, 3 to 20 nm, or 5 to 15 nm.

In this example, the resist-underlying film 18 has a resistance to developing fluids that is used when forming the resist pattern in the chemically amplified resist film 20, and is in the form of an organic film or an inorganic film containing an element serving to increase the etching rate to an etchant that is used when etching the light-shielding film 13 using the resist pattern as a mask, i.e. an element which is an element (activation species) contained in the resist-underlying film and released during etching of the resist-underlying film so as to act on the etchant. The amount of this element contained in the resist-underlying film 18 is properly adjusted so that the etching rate of the resist-underlying film 18 becomes higher than that of the chemically amplified resist film 20 in etching the light-shielding film 13 using the resist pattern as a mask. If an organic film is used as the resist-underlying film 18, it is possible to exhibit the sufficient deactivation suppression function with an extremely thin film thickness and to properly enhance the etching rate and, further, the adhesion to the chemically amplified resist film 20 becomes excellent, which is thus preferable. As a method of obtaining a resist-underlying film containing an element (activation species) serving to increase the etching rate, there is a method of ion-implanting the element into the surface of the resist-underlying film and, in the case of an organic film, such a resist-underlying film can be obtained by, other than the above method, selecting an organic compound containing the above element and using it as the resist-underlying film 18. Normally, a mask blank has the chemically amplified resist film 20 formed on the resist-underlying film 18.

In a modification of this embodiment, the mask blank 10 may be a mask blank for a phase shift mask. In this case, for example, the mask blank 10 further comprises a phase shift film between the transparent substrate 12 and the light-shielding film 13. As the phase shift film, use can be made, for example, of one of various known halftone films of chromium series (CrO, CrF, etc.), molybdenum series (MoSiON, MoSiN, MoSiO, etc.), tungsten series (WSiON, WSiN, WSiO, etc.), and silicon series (SiN etc.). The mask blank 10 for a phase shift mask may have a phase shift film on the light-shielding film 13. On the other hand, the mask blank 10 may have a halftone film as the light-shielding film 13.

FIG. 1(*b*) shows the state where the chemically amplified resist film 20 is patterned by an exposure/development process. Using the chemically amplified resist film 20 thus patterned as a mask, the resist-underlying film 18 and the light-shielding film 13 are subjected to etching to thereby pattern the light-shielding film 13 and, finally, the chemically amplified resist film 20 and the resist-underlying film 18 are removed, so that it is possible to manufacture a photomask having a light-shielding film pattern serving as a transfer pattern formed on the transparent substrate 12.

Herein, under the conditions for etching the light-shielding film 13 and so on, the etching rate of the resist-underlying film 18 is, for example, 0.3 nm/second or more, more preferably 1.0 nm/second or more, and further preferably 2.0 nm/second or more. The conditions for etching the light-shielding film 13 are the etching conditions in a process of etching the light-shielding film 13 using the patterned chemically amplified resist film 20 as a mask.

In this case, under the etching conditions, the etching rate of the resist-underlying film is set higher than the etching rate at which the chemically amplified resist film 20 used as a mask is etched. Therefore, according to this example, the light-shielding film 13 can be etched without lowering the resolution of the chemically amplified resist film 20. This makes it possible to enhance the resolution of patterning of the light-shielding film 13. The etching rate of the resist-underlying film 18 is, for example, 1.2 to 10 times that of the chemically amplified resist film 20 and more preferably 1.5 to 5 times.

Hereinbelow, there are shown examples of the first embodiment of this invention and comparative examples.

Example 1

A synthetic quartz substrate having a 6-inch square size with a thickness of 0.25 inches was used as a transparent substrate 12. A chromium nitride film 22 and a chromium carbonitride film 24 were formed as a light-shielding layer 14 on the transparent substrate 12 by the sputtering method, respectively. Subsequently, a chromium oxynitride film was formed as an antireflection layer 16. A light-shielding film 13 was configured to contain nitrogen in substantially the entire region thereof in its film thickness direction. The film thickness of the light-shielding film 13 was set to 68 nm.

Further, an organic film (FKB-15B: manufactured by FUJIFILM Electronic Materials Co., Ltd.) was coated to 30 nm by the spin-coating method, thereby forming a resist-underlying film 18. Thereafter, the resist-underlying film 18 was dried by heat treatment on a hot plate at 200° C. for 10 minutes. Then, as a chemically amplified resist film 20, a chemically amplified positive resist (FEP171: manufactured by FUJIFILM Electronic Materials Co., Ltd.) for electron beam exposure was coated to a thickness of 300 nm by the spin-coating method. Thereafter, the chemically amplified resist film 20 was dried by heat treatment on a hot plate at 130° C. for 10 minutes, thereby obtaining a mask blank 10 being a photomask blank with a chemically amplified resist film for ArF excimer laser exposure.

Comparative Example 1

A mask blank according to Comparative Example 1 was obtained in the same manner as Example 1 except that a resist-underlying film 18 was not formed.

Comparative Example 2

A mask blank according to Comparative Example 2 was obtained in the same manner as Example 1 except that an organic film (OSCAL930: manufactured by Tokyo Ohka Kogyo Co., Ltd.) was used as a resist-underlying film.

With respect to the mask blanks according to Example 1 and Comparative Examples 1 and 2, patterning of the light-shielding films was performed for comparing the differences in resolution therebetween. At first, the mask blanks were each exposed using an electron beam exposure apparatus and, thereafter, through a baking process and a development process after the exposure, resist patterns were formed. This exposure was performed using an electron beam accelerated by an acceleration voltage of 50 keV or more.

Subsequently, using each resist pattern as a mask, the resist-underlying film 18 and the light-shielding film 13 were subjected to patterning by dry etching using an etching gas containing a chlorine gas and an oxygen gas. Under the dry etching conditions, the etching rate of the resist-underlying film 18 of Example 1 was 2 nm/second. On the other hand, the etching rate of the resist-underlying film of Comparative Example 2 was 0.2 nm/second and thus was lower as compared with Example 1. The dry etching rate of each chemically amplified resist film 20 was 0.6 nm/second. Therefore, the dry etching rate of the resist-underlying film 18 of Example 1 was 3.3 times that of the chemically amplified resist film 20, while the dry etching rate of the resist-underlying film 18 of Comparative Example 2 was 0.3 times that of the chemically amplified resist film 20.

In Example 1, it was confirmed that no footing-shaped projecting portions were formed at the bottom of the resist pattern. Further, it was confirmed that the light-shielding film 13 was patterned without degradation in resolution of the resist pattern.

The chemically amplified resist film 20 and the resist-underlying film 18 were removed to form a photomask and projecting portions (with pattern edge jaggedness) of the light-shielding film 13 were examined by a SEM (Scanning Electron Microscope) and found to have a jaggedness of about 10 nm or less. It was confirmed that a 100 nm line and space pattern was resolved. Further, the pattern line-width accuracy required for a photomask in the 65 nm semiconductor design rule was satisfied. The removal of the chemically amplified resist film 20 and the resist-underlying film 18 was performed by immersion into a resist stripping solution in which aqueous hydrogen peroxide was added to concentrated sulfuric acid.

In Comparative Example 1, it was confirmed that footing-shaped projecting portions were formed at the bottom of the resist pattern. The chemically amplified resist film was removed to form a photomask and projecting portions (with pattern edge jaggedness) of the light-shielding film were examined by a SEM (Scanning Electron Microscope) and found to have a jaggedness of about 30 nm or less. Further, a 200 nm line and space pattern was merely resolved.

In Comparative Example 2, the resolution of the resist pattern was lowered due to the influence of the dry etching. Therefore, the chemically amplified resist film and the resist-underlying film were removed to form a photomask and projecting portions (with pattern edge jaggedness) of the light-shielding film were examined by a SEM (Scanning Electron Microscope) and found to have a jaggedness of about 30 nm or less. Further, a 200 nm line and space pattern was merely resolved.

Comparative Example 3

A mask blank according to Comparative Example 3 was obtained in the same manner as Example 1 except that an organic film not containing an element serving to increase the etching rate was used as a resist-underlying film. Further, the evaluation of patterning was performed in the same manner as described above. The etching rate of the resist-underlying film 18 in Comparative Example 3 was 0.5 nm/second and thus was 0.8 times that of the chemically amplified resist film.

As a result, although it was confirmed that a 100 nm line and space pattern was resolved, when, using a resist pattern as a mask, the exposed resist-underlying film and the light-shielding film were continuously removed by dry etching using an etching gas containing a chlorine gas and an oxygen gas, degradation in resolution of a light-shielding film pattern was caused. The pattern line-width accuracy required for a photomask in the 65 nm semiconductor design rule was not satisfied.

Example 2

A mask blank was fabricated in the same manner as Example 1 except that, by properly selecting the molecular weight of a resist-underlying film and an organic compound containing an element serving to increase the dry etching rate, the film thickness of the resist-underlying film 18 was set to 10 nm and the etching rate thereof was set to 1.3 times that of a chemically amplified resist film. Further, a photomask was fabricated using this mask blank. As a result, it was confirmed that the jaggedness of projecting portions of a light-shielding film 13 was restrained to about 10 nm or less and a 100 nm line and space pattern was resolved. Further, the pattern line-width accuracy required for a photomask in the 65 nm semiconductor design rule was satisfied.

FIG. 2 shows an example of a mask blank 10 according to a second embodiment of this invention. FIG. 2 (*a*) shows an example of the configuration of the mask blank 10. In FIG. 2, the same or similar structures as those in FIG. 1 are assigned the same symbols as those in FIG. 1, thereby omitting explanation thereof except those points that will be explained hereinbelow. In this example, the mask blank 10 comprises a transparent substrate 12, a light-shielding film 13 (a laminated film of a light-shielding layer 14 and an antireflection layer 16), a silicon-containing film 32 (a film containing silicon), a resist-underlying film 34 made of an organic material, and a chemically amplified resist film 20.

The silicon-containing film 32 is a film containing silicon for a hard mask that is used when patterning the light-shielding film 13, and is formed on the light-shielding film 13. The film thickness of the silicon-containing film 32 is, for example, 30 nm (e.g. 25 to 35 nm). The silicon-containing film 32 may be a film containing MoSi such as, for example, MoSiO, MoSiN, or MoSiON. The silicon-containing film 32 may alternatively be a film of TaSiO, TaSiN, TaSiON, WSiO, WSiN, WSiON, SiO, SiN, SiON, or the like. The silicon-containing film 32 for use as a hard mask is one example of a thin film for forming a transfer pattern.

The resist-underlying film 34 made of the organic material is an organic film for improving the adhesion between the silicon-containing film 32 and the chemically amplified resist film 20 and is formed on the silicon-containing film 32. The adhesion of the resist-underlying film 34 made of the organic material to the silicon-containing film 32 is greater than the adhesion of the chemically amplified resist film 20 to the silicon-containing film 32 when the chemically amplified resist film 20 is formed on the silicon-containing film 32.

Further, in this example, the resist-underlying film 34 is the same as or similar to the resist-underlying film 18 (see FIG. 1) in the first embodiment. Therefore, the resist-underlying film 34 further also has the function as the resist-underlying film 18 having the deactivation suppression effect. The film thickness of the resist-underlying film 34 is, for example, 25 nm or less (e.g. 1 to 25 nm), more preferably 1 to 15 nm, and further preferably 5 to 10 nm. Normally, a mask blank has the chemically amplified resist film 20 formed on the resist-underlying film 34.

FIG. 2 (*b*) shows the state where the chemically amplified resist film 20 is patterned by the electron beam lithography. Using the chemically amplified resist film 20 thus patterned as a mask, the resist-underlying film 34 and the silicon-containing film 32 are etched. Then, using the silicon-containing film 32 as a mask (hard mask), the light-shielding film 13 is etched and thus it is possible to manufacture a photomask having the patterned light-shielding film 13.

Herein, under the conditions for etching the silicon-containing film 32, the etching rate of the resist-underlying film 34 is, for example, 0.3 nm/second or more, more preferably 1.0 nm/second or more, and further preferably 2.0 nm/second or more. The conditions for etching the silicon-containing film 32 are the etching conditions in a process of etching the silicon-containing film 32 using the patterned chemically amplified resist film 20 as a mask.

In this case, under the etching conditions, it is preferable that the etching rate of the resist-underlying film 34 be set higher than the etching rate at which the chemically amplified resist film 20 used as a mask is etched. Therefore, according to this example, the silicon-containing film 32 can be etched without lowering the resolution of the chemically amplified resist film 20. This makes it possible to enhance the resolution of patterning of the silicon-containing film 32. Further, since the resolution of patterning of the silicon-containing film 32 used as a hard mask is enhanced, it is possible to enhance the resolution of the light-shielding film 13. The etching rate of the resist-underlying film 34 is, for example, 1.2 to 10 times that of the chemically amplified resist film 20 and more preferably 1.5 to 5 times. Only for the purpose of improving the adhesion to the chemically amplified resist film, the etching rate of the resist-underlying film 34 may be set lower than the etching rate at which the chemically amplified resist film 20 is etched.

Hereinbelow, there are shown an example of the second embodiment of this invention and a comparative example.

Example 3

Using a transparent substrate 12 the same as that in Example 1, a light-shielding film 13 was formed in the same manner as Example 1. Further, a MoSiON film was formed as a silicon-containing film 32. The film thickness of the silicon-containing film 32 was set to 30 nm.

Then, an organic film (FKB-15B: manufactured by FUJI-FILM Electronic Materials Co., Ltd.) of the same material as in Example 1 was coated to 30 nm by the spin-coating method, thereby forming a resist-underlying film 34. Thereafter, the resist-underlying film 34 was dried by heat treatment on a hot plate at 200° C. for 10 minutes. Then, a chemically amplified resist film 20 was formed in the same manner as Example 1, thereby obtaining a mask blank 10 being a chemically amplified resist film coated photomask blank.

Comparative Example 4

A mask blank according to Comparative Example 4 was obtained in the same manner as Example 3 except that a resist-underlying film 34 was not formed.

With respect to the mask blanks according to Example 3 and Comparative Example 4, patterning of the chemically amplified resist films was performed for comparing the difference in adhesion between the chemically amplified resist film and the silicon-containing film. At first, the mask blanks were each exposed using an electron beam exposure apparatus and, thereafter, through a baking process and a development process after the exposure, resist patterns were formed. This exposure was performed using an electron beam accelerated by an acceleration voltage of 50 keV or more.

In Example 3, it was confirmed that the adhesion between the chemically amplified resist film 20 and the silicon-containing film 32 was excellent due to the resist-underlying film 34 and, therefore, a desired line and space pattern was securely formed.

In Comparative Example 4, the adhesion between the chemically amplified resist film and the silicon-containing film was insufficient so that disappearance of the resist pattern occurred during the development process.

Subsequently, with respect to the mask blank according to Example 3, using the resist pattern as a mask, the resist-underlying film 34 and the silicon-containing film 32 were subjected to patterning by dry etching using a fluorine-based etching gas. In Example 3, the etching rate of the resist-underlying film 34 under the conditions for etching the silicon-containing film 32 was sufficiently higher than that of the chemically amplified resist film 20. Therefore, there occurred no degradation in resolution of the resist pattern due to the influence of the dry etching.

While this invention has been described in terms of the embodiments, the technical scope of this invention is not limited to the scope of the description of the foregoing embodiments. It is obvious to a person skilled in the art that it is possible to add various changes or improvements to the foregoing embodiments. It is clear from the description of the claims that those embodiments added with such changes or improvements can also be included in the technical scope of this invention.

INDUSTRIAL APPLICABILITY

This invention is suitably applicable to mask blanks and masks for use in the manufacture of semiconductor devices, liquid crystal display devices, and so on.

BRIEF DESCRIPTION OF THE DRAWINGS

FIG. 1 (a) shows an example of the configuration of the mask blank 10. FIG. 1 (b) shows the state where a chemically amplified resist film 20 is patterned by an exposure/development process.

DESCRIPTION OF SYMBOLS

Figure 1:
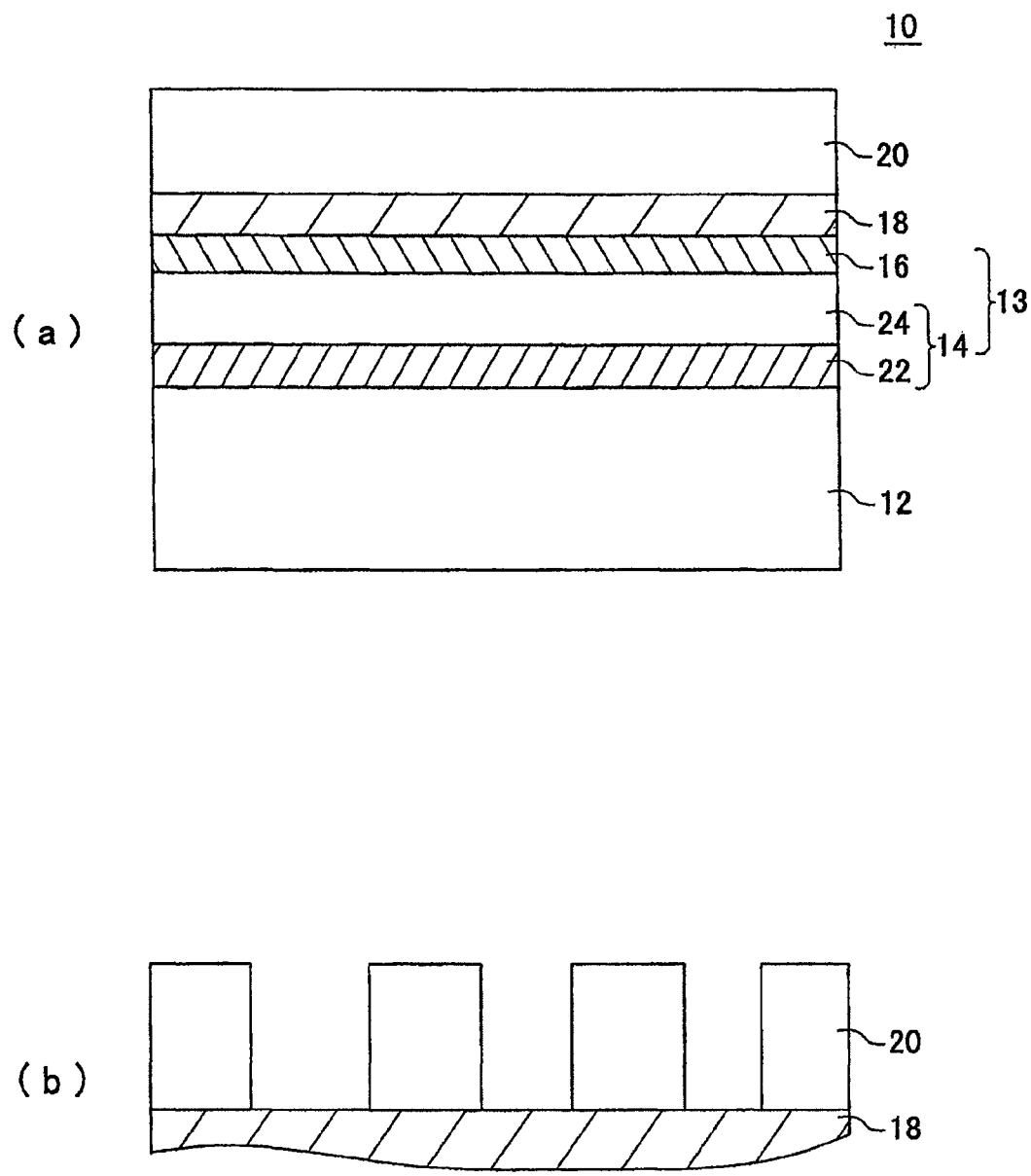
FIG. 1 shows an example of a mask blank 10 according to a first embodiment of this invention.
Figure 2:
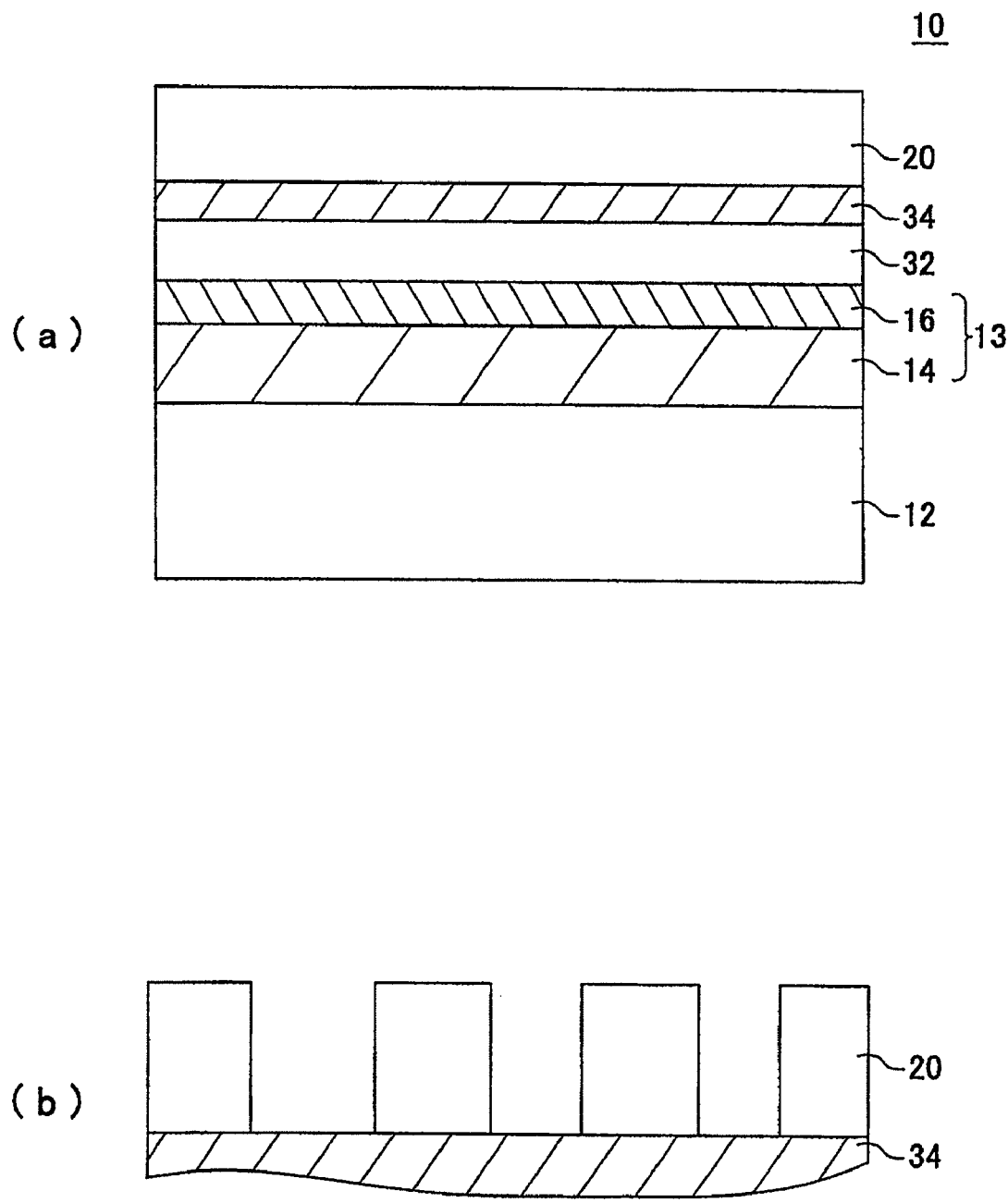
FIG. 2 shows an example of a mask blank 10 according to a second embodiment of this invention, wherein FIG. 2 (a) shows an example of the configuration of the mask blank 10 and FIG. 2 (b) shows the state where a chemically amplified resist film 20 is patterned by the electron beam lithography.

10 . . . mask blank, 12 . . . transparent substrate, 13 . . . light-shielding film, 14 . . . light-shielding layer, 16 . . . antireflection layer, 18 . . . resist-underlying film, 20 . . . chemically amplified resist film, 22 . . . chromium nitride film, 24 . . . chromium carbonitride film, 32 . . . silicon-containing film, 34 . . . resist-underlying film

The invention claimed is:

1. A mask blank to be formed with a chemically amplified resist film, said mask blank comprising:
    a substrate,
    a thin film to be a transfer pattern or a thin film for forming a transfer pattern, said thin film formed above said substrate, and
    a resist-underlying film formed between said to be formed chemically amplified resist film and said thin film,
    wherein said thin film contains a metal and at least one element of oxygen and nitrogen, and
    when said thin film is to be etched using as an etching mask said to be formed chemically amplified resist film after forming and patterning, an etching rate of said resist-underlying film is to be higher than that of said to be formed chemically amplified resist film.

2. A mask blank according to claim 1, wherein said resist-underlying film has a film thickness of 25 nm or less.

3. A mask blank according to claim 1, wherein said to be formed chemically amplified resist film would have a film thickness of 300 nm or less.

4. A mask blank according to claim 1, wherein said thin film contains chromium and at least one element of oxygen and nitrogen.

5. A mask blank according to claim 1, wherein said mask blank is a mask blank for a dry etching process adapted to a fabrication method of a mask used for patterning said thin film by the dry etching process with a chlorine-based dry etching gas containing chlorine that would use as the etching mask a resist pattern to be formed from said to be formed chemically amplified resist film.

6. A mask blank according to claim 1, further comprising said chemically amplified resist film formed on the resist-underlying film.

7. A mask blank according to claim 1, wherein the etching rate of said resist-underlying film is to be 1.2 to 10 times that of said to be formed chemically amplified resist film.

8. A mask blank according to claim 1, wherein said resist-underlying film is made of an organic material or an inorganic material.

9. A mask blank according to claim 1, wherein said resist-underlying film is made of an organic material or an inorganic material containing an element which is an element (activation species) contained in the resist-underlying film and released during etching of the resist-underlying film so as to act on the etchant.

10. A mask blank according to claim 1, wherein said to be formed chemically amplified resist film is to be subjected to exposure with an electron beam.

11. A mask comprising a transfer pattern formed by patterning said thin film in the mask blank according to claim 1.

12. A mask blank to be formed with a chemically amplified resist film, said mask blank comprising:
  a substrate,
  a thin film to be a transfer pattern, said thin film formed on said substrate,
  a silicon-containing film formed on said thin film and made of a material containing silicon, and
  a resist-underlying film formed between said to be formed chemically amplified resist film and said silicon-containing film,
  wherein said resist-underlying film is made of an organic material, and
  when said silicon-containing film is to be etched using as an etching mask said to be formed chemically amplified resist film after forming and patterning, an etching rate of said resist-underlying film is to be higher than that of said to be formed chemically amplified resist film.

13. A mask blank according to claim 12, wherein said resist-underlying film has a film thickness of 25 nm or less.

14. A mask blank according to claim 12, wherein said to be formed chemically amplified resist film would have a film thickness of 300 nm or less.

15. A mask blank according to claim 12, wherein said thin film contains chromium and at least one element of oxygen and nitrogen.

16. A mask blank according to claim 12, wherein said mask blank is a mask blank for a dry etching process adapted to a fabrication method of an etching mask to be used for patterning said thin film by the dry etching process with a chlorine-based dry etching gas containing chlorine that would use as the etching mask a resist pattern to be formed from said to be formed chemically amplified resist film.

17. A mask blank according to claim 12, further comprising said chemically amplified resist film formed on the resist-underlying film.

18. A mask blank according to claim 12, wherein the etching rate of said resist-underlying film is to be 1.2 to 10 times that of said to be formed chemically amplified resist film.

19. A mask blank according to claim 12, wherein said resist-underlying film is made of an organic material or an inorganic material containing an element which is an element (activation species) contained in the resist-underlying film and released during etching of the resist-underlying film so as to act on the etchant.

20. A mask blank according to claim 12, wherein said to be formed chemically amplified resist film is to be subjected to exposure with an electron beam.

21. A mask comprising a transfer pattern formed by patterning said thin film in the mask blank according to claim 12.

* * * * *